United States Patent
Kell et al.

(10) Patent No.: US 10,585,134 B2
(45) Date of Patent: Mar. 10, 2020

(54) METHOD AND SYSTEM FOR LOCATING GROUND FAULTS IN A NETWORK OF DRIVES

(71) Applicant: GENERAL ELECTRIC COMPANY, Schenectady, NY (US)

(72) Inventors: Max-Josef Kell, Bavaria (DE); Stefan Schroeder, Bavaria (DE); Jie Shen, Shanghai (CN); Zhihui Yuan, Bavaria (DE); Yunzheng Chen, Bavaria (DE); Mohamed Hashem, Bavaria (DE)

(73) Assignee: general electric company, schenectady, NY (US)

( * ) Notice: Subject to any disclaimer, the term of this patent is extended or adjusted under 35 U.S.C. 154(b) by 28 days.

(21) Appl. No.: 15/766,132

(22) PCT Filed: Oct. 5, 2015

(86) PCT No.: PCT/US2015/053981
§ 371 (c)(1),
(2) Date: Apr. 5, 2018

(87) PCT Pub. No.: WO2017/061981
PCT Pub. Date: Apr. 13, 2017

(65) Prior Publication Data
US 2018/0306853 A1   Oct. 25, 2018

(51) Int. Cl.
*G01R 31/08* (2006.01)
*H02H 3/16* (2006.01)
(Continued)

(52) U.S. Cl.
CPC ......... *G01R 31/086* (2013.01); *H02H 1/0007* (2013.01); *H02H 3/105* (2013.01);
(Continued)

(58) Field of Classification Search
None
See application file for complete search history.

(56) References Cited

U.S. PATENT DOCUMENTS

| | | |
|---|---|---|
| 5,214,575 A | 5/1993 | Sugishima et al. |
| 5,363,018 A | 11/1994 | Shackle |

(Continued)

FOREIGN PATENT DOCUMENTS

| | | |
|---|---|---|
| JP | 2006-311692 A | 11/2006 |
| JP | 2008-109748 A | 5/2008 |
| WO | 2013/153596 A1 | 10/2013 |

OTHER PUBLICATIONS

Rodriguez-Valdez, C. D., et al.,"Method to Detect Line-To-Ground Faults in High-Resistance Ground Networks," IEEE Energy Conversion Congress and Exposition (ECCE), pp. 2284-2292 (2010).
Rodriguez-Valdez, C. D., et al.,"Method for line-ground fault detection in variable frequency drives," IEEE 58th Annual Record of Conference Papers Industry Applications Society, Petroleum and Chemical Industry Conference (PCIC), pp. 1-7 (2011).
International Search Report and Written Opinion issued in connection with corresponding PCT Application No. PCT/US2015/053981 dated Jun. 3, 2016.

*Primary Examiner* — Clayton E. LaBalle
*Assistant Examiner* — Jas A Sanghera
(74) *Attorney, Agent, or Firm* — Wood IP LLC

(57) ABSTRACT

A drive system includes a current sensor configured to generate a first current signal representative of a current flowing in one or more electrical devices electrically coupled together through a power supply bus, a power output bus, and a common ground. The drive system also includes a voltage sensor configured to generate a first voltage signal representative of a voltage with respect to the common ground in the one or more electrical devices. The drive system further includes a ground fault detection controller configured to determine a ground fault in the one or more electrical devices based on a change in at least one of the first current signal and the first voltage signal.

19 Claims, 8 Drawing Sheets

(51) Int. Cl.
*H02H 7/22* (2006.01)
*H02H 3/10* (2006.01)
*H02H 3/36* (2006.01)
*H02H 7/12* (2006.01)
*H02J 3/36* (2006.01)
*H02H 1/00* (2006.01)
*G01R 31/02* (2006.01)
*H02H 7/122* (2006.01)
*H02H 7/125* (2006.01)

(52) U.S. Cl.
CPC .............. *H02H 3/162* (2013.01); *H02H 3/36* (2013.01); *H02H 7/1216* (2013.01); *H02H 7/22* (2013.01); *H02J 3/36* (2013.01); *G01R 31/025* (2013.01); *H02H 7/122* (2013.01); *H02H 7/125* (2013.01); *Y02E 60/60* (2013.01)

(56) References Cited

U.S. PATENT DOCUMENTS

| | | |
|---|---|---|
| 7,751,993 B2 | 7/2010 | Mirafzal |
| 7,894,169 B2 | 2/2011 | Valdez et al. |
| 8,067,942 B2 | 11/2011 | Pan et al. |
| 8,593,150 B2 | 11/2013 | Vrankovic et al. |
| 8,649,130 B2 | 2/2014 | Horikoshi et al. |
| 8,698,504 B2 | 4/2014 | Wei et al. |
| 2009/0296289 A1* | 12/2009 | Valdez .................. H02H 3/17 361/47 |
| 2013/0293988 A1 | 11/2013 | Li et al. |
| 2013/0322133 A1 | 12/2013 | Li |

* cited by examiner

METHOD AND SYSTEM FOR LOCATING GROUND FAULTS IN A NETWORK OF DRIVES

BACKGROUND

The field of the disclosure relates generally to electric drive power systems and, more particularly, to a systems and methods of detecting ground faults in a network of a plurality of transformer-less drive power supplies.

At least some known solidly grounded power distribution systems generate an electrical arc when a ground fault occurs. In certain environments such an arc can ignite an explosive atmosphere in proximity to the arc location. In non-solidly grounded systems a first ground fault will not cause an electrical arc to be generated, but a second ground fault occurring in a system that has an existing ground fault can cause such an arc. It may be a system operator specification or a requirement by industrial or operating standards to trip the system after a first ground fault because the second ground fault would lead to a phase-to-phase to ground short circuit and potential arc. However, if the first ground fault is detected and disconnected from the mains supply before a second ground fault develops, the system is more resilient to ground faults and achieves higher mean time between failures (MTBF) values.

BRIEF DESCRIPTION

In one aspect, a drive system is provided. The system includes a current sensor configured to generate a first current signal representative of a current flowing in one or more electrical devices electrically coupled together through a power supply bus, a power output bus, and a common ground. The drive system also includes a voltage sensor configured to generate a first voltage signal representative of a voltage with respect to the common ground in the one or more electrical devices. The drive system further includes a controller configured to determine a ground fault in the one or more electrical devices based on a change in at least one of the first current signal and the first voltage signal.

In another aspect, a method of detecting a ground fault in one or more electrical devices in a network of a plurality of electrical devices is provided. The method includes receiving a first current signal representative of a current flowing in at least some of the plurality of electrical devices. The method also includes receiving a first voltage signal representative of a voltage with respect to a DC link midpoint voltage or to ground in the at least some of the plurality of electrical devices. The method further includes determining a ground fault in one or more of the at least some of the plurality of electrical devices based on a change in at least one of the first current signal and the first voltage signal.

In yet another aspect, an electrical power converter system is provided. The system includes a plurality of power converter devices electrically coupled to a single power supply bus. Each power converter device is non-solidly grounded. Each power converter device includes an AC-DC converter including an AC input and a DC output. The system includes a DC-AC inverter including a DC input and an AC output. The system further includes a DC link electrically coupled between a DC output of the AC-DC converter and a DC input of the DC-AC inverter. The electrical power converter system also includes a ground detection device configured to determine a ground fault in one or more of the plurality of power converter devices based on a change in at least one of an AC input current signal, AC output current signal, and a voltage signal of the DC link with respect to ground.

DRAWINGS

These and other features, aspects, and advantages of the present disclosure will become better understood when the following detailed description is read with reference to the accompanying drawings in which like characters represent like parts throughout the drawings, wherein.

Figure 1:
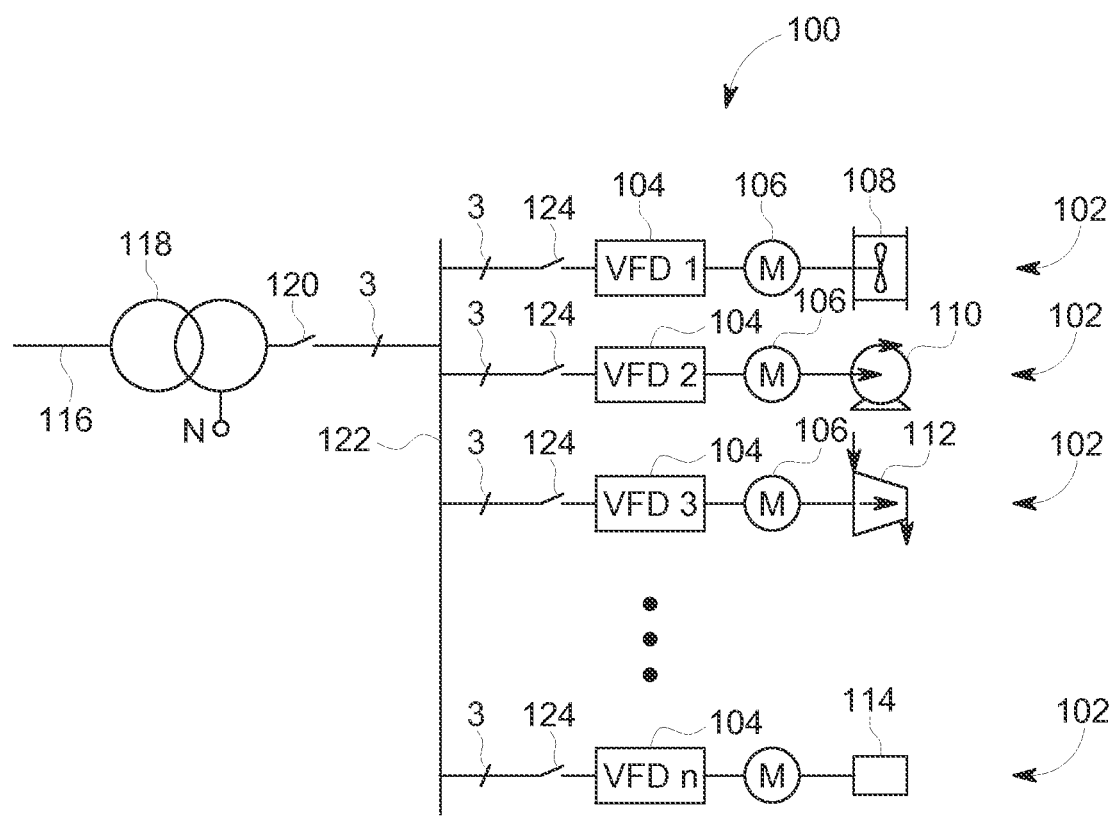
FIG. 1 is a schematic block diagram of a network of transformer-less drive systems, that each typically includes a power converter that may be configured as a variable frequency drive (VFD)

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

The following detailed description describes embodiments of the disclosure by way of example and not by way of limitation. It is contemplated that the disclosure has general application to analytical and methodical embodiments of detecting ground faults in industrial, commercial, and residential applications.

Embodiments are described herein of a drive system configured to identify a first ground fault within a converter network and selectively disconnect only the faulty converter before higher-level protection acts on the complete converter network. In various embodiments, a ground fault detection controller is integrated into the converter system using existing sensors. Furthermore, the embodiments described herein enable selective tripping of only a ground faulted converter in a multi-converter system to achieve a higher system availability.

The ground fault detection controller applies especially to non-solidly grounded systems which can be used in industrial settings to achieve higher availability and/or to avoid the occurrence of arc flashes, for example to facilitate complying with industrial standards. In a non-solidly grounded system, the first ground fault only shifts the systems potential with respect to earth and does not provide a short-circuit path. In this case, the fault currents are small compared to the short-circuit current of a system with solid grounding.

However, the fault current normally is not high enough to reach the overcurrent protection threshold of a circuit breaker supplying the converter. The ground fault detection controller analyzes the converters already existing sensors to determine if a ground fault condition is present. It acts autonomously on each converter and achieves selectivity, i.e., the converter trips before the system, for most fault conditions.

As described herein, the ground fault detection controller uses the converters' existing sensors to detect ground fault conditions. Specifically, it uses the converters' AC input voltage sensors, mid-to-ground voltage sensor, and the input and output side current transducers. If available, a current transducer measuring a fraction of earth currents flowing over the main protective earth (PE) connection point can also be used.

The underlying principle of the detection method is that a first ground fault generates a shift in the systems voltage potential with respect a DC link midpoint voltage or to ground. The magnitude of this voltage shift is determined by three main factors, the phase-to-neutral voltage value at the point of failure, the fault resistance, and the impedance of the return path for the fault currents.

Because this detection method is applied to non-solidly grounded networks, the first ground fault does not cause high short circuit currents. However there is always still a return path for available current and a fault current starts to flow. For example in a completely floating network, the return path would be created by displacement currents flowing over parasitic capacitances to earth.

As described herein, a resistance-capacitance (RC) branch of an input sine filter of each converter is connected to earth. This provides a dominant return path for the fault currents during a first ground fault. The RC branch is still limiting the fault currents to values much lower than those reached under a short circuit fault.

To detect the first ground fault, either a voltage shift is detected and/or fault currents are measured. In the exemplary embodiment, a ground detection module, including one or more algorithms, uses a combination of both basic quantities. For a single converter system, it is sufficient to detect a change in a $V_{dcmid\text{-}to\text{-}ground}$ measurement (voltage shift).

For a network of multiple converters, the grid or motor side current sensors are used to measure the fault currents. Because the fault currents are flowing as common mode currents, it is possible to distinguish between operating currents (differential mode) and fault currents (common mode). If only the voltage shift was measured, a distinction between the faulty and healthy converters is not possible because all share the same potentials.

However under certain circumstances (for example high fault resistance), the fault currents may be too small to be detected. Then the converters AC input voltage sensors are used to measure a common-mode voltage drop across the inductive component (common mode choke). The choke acts, in this case, as a current amplifier, because the small fault current values multiplied with the high common mode choke impedance (if $x=Z_{cmc}$) creates a measurable voltage drop.

Similarly, a sensor measuring the PE currents, if installed, extends the detection range of the algorithms of the ground detection module. The criterion in this case is to detect an in/out phase condition relative to the $V_{dcmid\text{-}to\text{-}pound}$ voltage. Additional sensors, if installed, are used by the ground detection module to further localize the fault. For example, ground detection module of controller 140 may include a circuit model used to compare expected sensor values to actual sensor values in real time. The computations of the ground detection module may be used to warn operators and/or initiate protective actions depending on a severity of the ground fault.

Moreover, although described herein as a αβ-dq transformation of the $V_{dcmid}$ signal in combination with low pass filtering solution, the ground fault detection controller described herein may also be implemented using different methods to implement the same functionality. For example, phase-locked loops, band-pass filters, or another signal processing implementation with reasonably low computing requirements may be used. Embodiments of the ground fault detection controller do not involve any signal injection to the system, and is based solely on the available current and voltage measurements in the drive.

FIG. 1 is a schematic block diagram of a network 100 of transformer-less drive systems 102, that each typically includes a power converter 104 that may be configured as a variable frequency drive (VFD). Power converter 104 is configured to drive a motor 106, which is coupled to a rotatable device, such as, but, not limited to a fan 108, a pump 110, a compressor 112, or other load 114. In the exemplary embodiment, network 100 is supplied with electrical power from a grid 116 through a step-down transformer 118 configured to step the supply voltage from a transmission voltage level to a distribution voltage level. A circuit breaker 120 permits isolating network 100 from grid 116. Each of transformer-less drive systems 102 is supplied through, for example, a three-phase AC input bus 122. A circuit breaker 124 in each of transformer-less drive systems 102 permits isolating a respective transformer-less drive system 102 from AC input bus 122 for normal startup and shutdown of transformer-less drive systems 102. Circuit breaker 124 may also include protective functions that permit transformer-less drive systems 102 to be automatically isolated from AC input bus 122 in case of a fault in a respective one of transformer-less drive systems 102 or other component.

Figure 2:
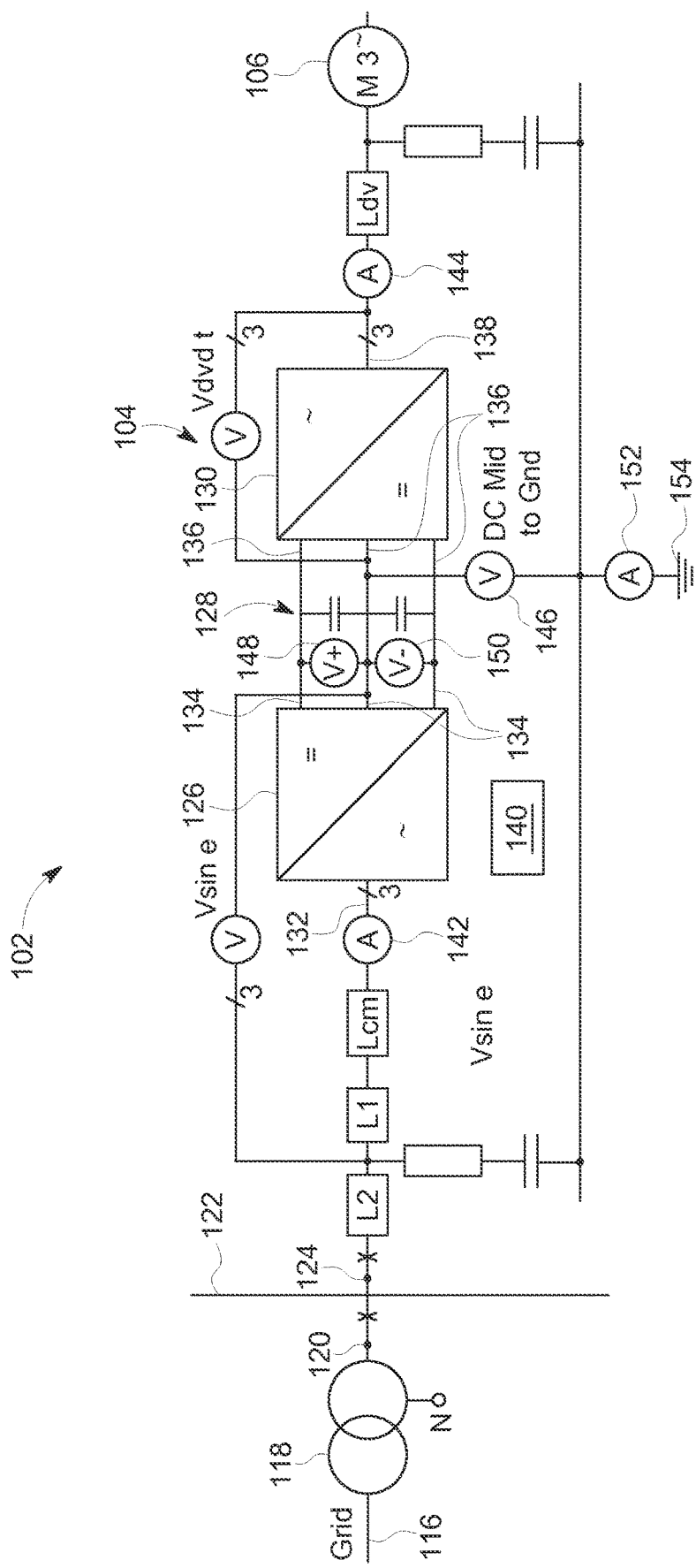
FIG. 2 is a schematic block diagram of the transformer-less drive system illustrating a 3-phase DC link configuration in accordance with an exemplary embodiment of the present invention.

FIG. 2 is a schematic block diagram of transformer-less drive system 102 illustrating a 3-phase DC link configuration in accordance with an exemplary embodiment of the present invention. In the exemplary embodiment, transformer-less drive system 102 includes a power converter 104 that may be configured as a variable frequency drive (VFD). Power converter 104 is configured to drive a motor 106, which is coupled to a rotatable device, such as, but, not limited to a fan 108, a pump 110, a compressor 112, or other load 114 (each shown in FIG. 1). In the exemplary embodiment, transformer-less drive system 102 is supplied with 3-phase electrical power from grid 116 through step-down transformer 118 configured to step the supply voltage from a transmission voltage level to a distribution voltage level. Circuit breaker 120 permits isolating transformer-less drive system 102 from grid 116. Each of transformer-less drive systems 102 is supplied through, for example, three-phase AC input bus 122 (shown in FIG. 1). Circuit breaker 124 in each of transformer-less drive systems 102 permits isolating a respective transformer-less drive system 102 from AC input bus 122 for normal startup and shutdown of transformer-less drive systems 102. Circuit breaker 124 may also include protective functions that permit transformer-less drive systems 102 to be automatically isolated from AC input bus 122 in case of a fault in a respective one of transformer-less drive systems 102 or other component.

Power converter 104 includes an AC-DC converter 126, a DC link 128, and a DC-AC inverter 130. An input 132 of AC-DC converter 126 is electrically coupled to AC input bus 122 and an output 134 of AC-DC converter 126 is electrically coupled to DC link 128. An input 136 of DC-AC inverter 130 is electrically coupled to DC link 128 and an output 138 of DC-AC inverter 130 is electrically coupled to a respective motor 106. In various embodiments, a ground fault detection controller 140 receives inputs from sensors installed in drive systems 102 or virtual sensors derived from measured parameters and/or models of transformer-less drive system 102 and/or network 100. For example, ground fault detection controller 140 is configured to receive first current signals from an input current sensor 142, an output current sensor 144, a first voltage signal from a DC mid-to-ground voltage sensor 146, second voltage signal from a +DC to DC mid voltage sensor 148, and a third voltage signal from a −DC to DC mid voltage sensor 150. In other embodiments, a ground path current sensor 152 generates a current signal representative of current flowing through a respective ground connection 154 to drive system 102. Additionally, characteristic impedances affect the response of drive systems 102 to a ground fault and thus, the ability of ground fault detection controller 140 to measure electrical parameters of drive systems 102 and determine a change in those parameters that indicates a ground fault in one of the plurality of drive systems 102.

Figure 3:
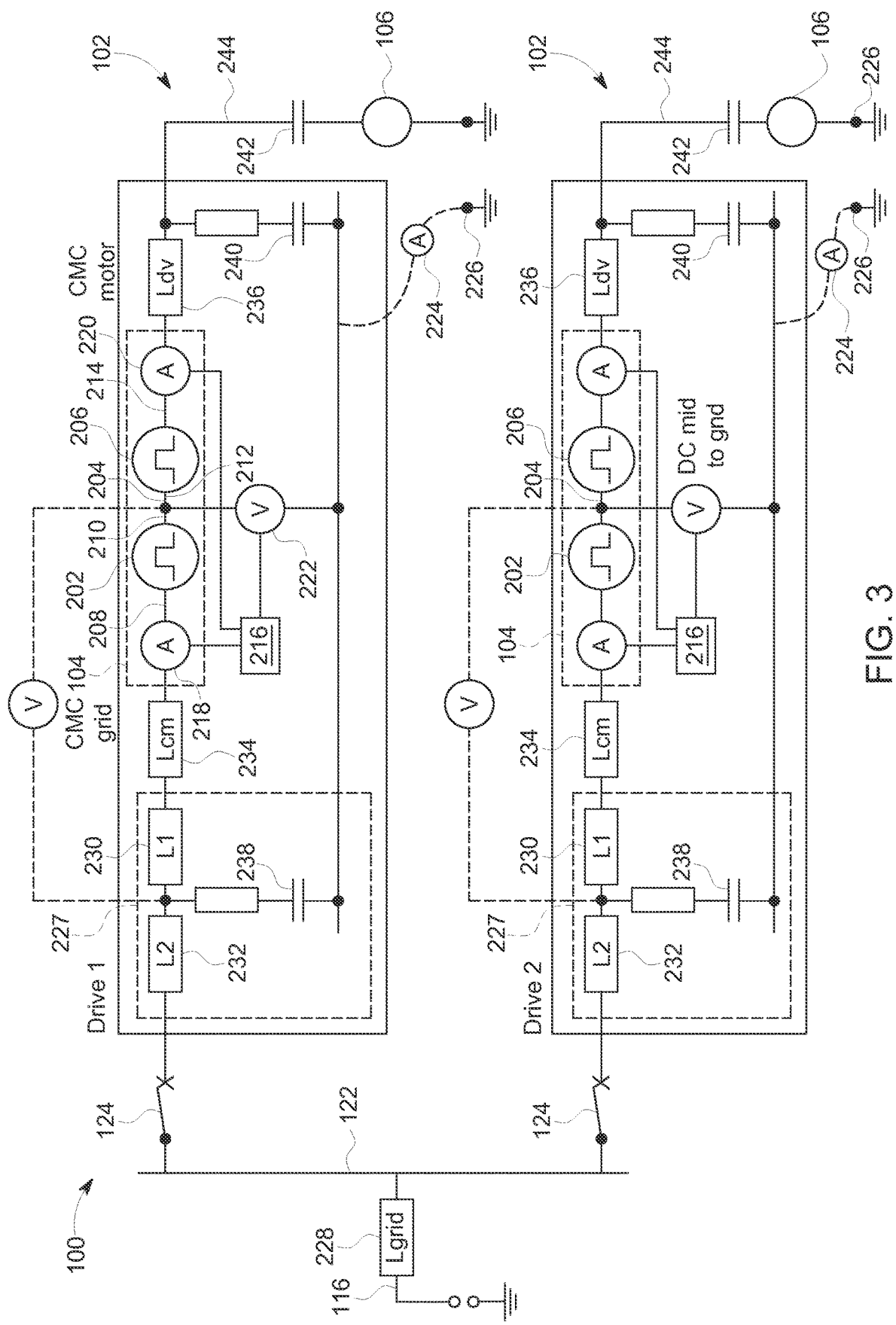
FIG. 3 is a common mode diagram of the network shown in FIG. 1 with two transformer-less drive systems.

FIG. 3 is a common mode diagram of network 100 with two transformer-less drive systems 102. In the exemplary embodiment, power converter 104 includes an AC-DC converter 202, a DC link 204, and a DC-AC inverter 206. An input 208 of AC-DC converter 202 is electrically coupled to AC input bus 122 and an output 210 of AC-DC converter 202 is electrically coupled to DC link 204. An input 212 of DC-AC inverter 206 is electrically coupled to DC link 204 and an output 214 of DC-AC inverter 206 is electrically coupled to a respective motor 106. In various embodiments, a ground fault detection controller 216 receives inputs from sensors installed in drive systems 102. For example, ground fault detection controller 216 receives first current signals from an input current sensor 218, an output current sensor 220, and first voltage signal from a DC mid-to-ground voltage sensor 222. In other embodiments, a ground path current sensor 224 generates a current signal representative of current flowing through a respective ground connection 226 to drive systems 102. Additionally, characteristic impedances affect the response of drive systems 102 to a ground fault and thus, the ability of ground fault detection controller 216 to measure electrical parameters of drive systems 102 and determine a change in those parameters that indicates a ground fault in one of the plurality of drive systems 102.

The characteristic impedances include a grid inductance 228, an impedance of a sine filter 227 including a first line inductance 230, a second line inductance 232, an input capacitance 238, a common mode inductance 234, a drive inductance 236, an output capacitance 240, and a capacitance 242 of a load cable 244 and motor 106.

Drive systems 102 are non-solidly grounded such that a single fault to ground will not initiate high enough fault currents to trip the over current protection of circuit breakers 124.

Figure 4:
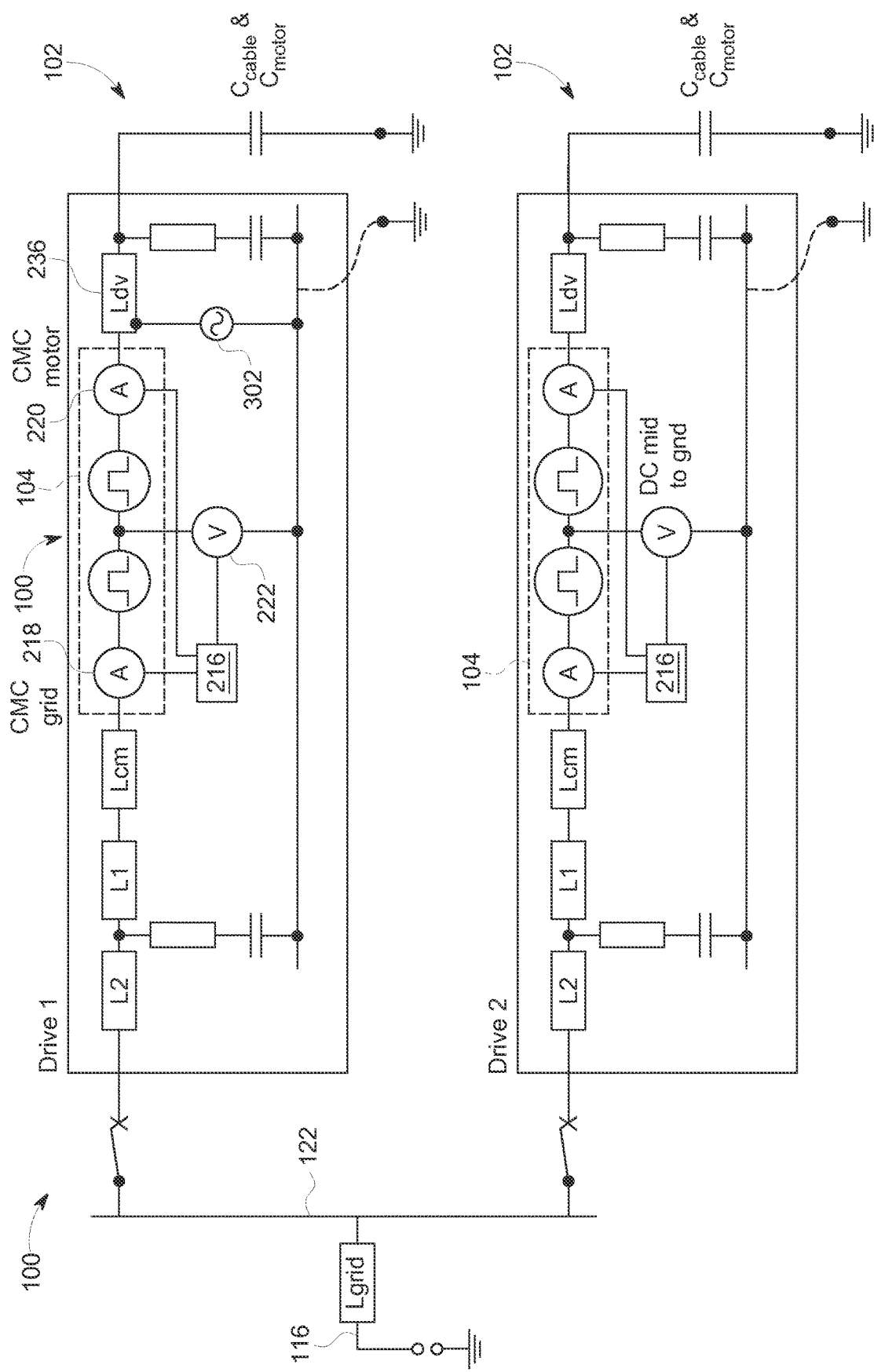
FIG. 4 is the common mode diagram of the network shown in FIG. 1 with two transformer-less drive systems and an exemplary ground fault illustrated to be in the drive inductance of a first of the two drive systems shown in FIG. 1.

FIG. 4 is the common mode diagram of network 100 with two transformer-less drive systems 102 and an exemplary ground fault 302 illustrated to be in drive inductance 236 of a first of the two drive systems 102. In the exemplary embodiment, an impedance of ground fault 302 is assumed to be zero Ω.

Figure 5:
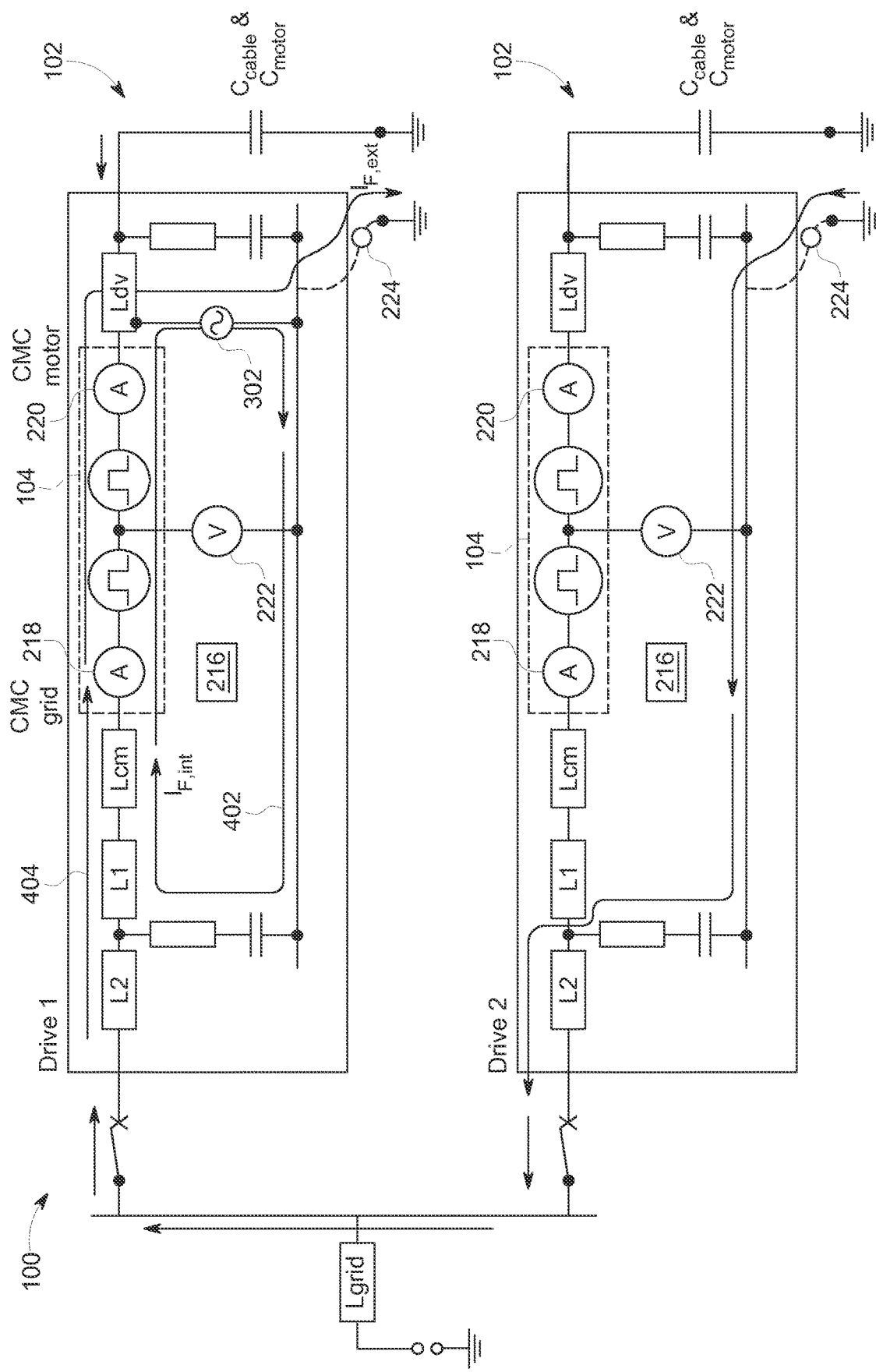
FIG. 5 is a common mode diagram of the network shown in FIG. 1 illustrating an internal fault current and an external fault current of the network shown in FIG. 1 as a result of the ground fault shown in FIG. 3.

FIG. 5 is the common mode diagram of network 100 illustrating an internal fault current 402 and an external fault current of 404 network 100 as a result of ground fault 302. It can be seen that internal fault current 402 and an external fault current affect the total current flowing through input current sensor 218, output current sensor 220, and, if available, through ground path current sensor 224.

Figure 6:
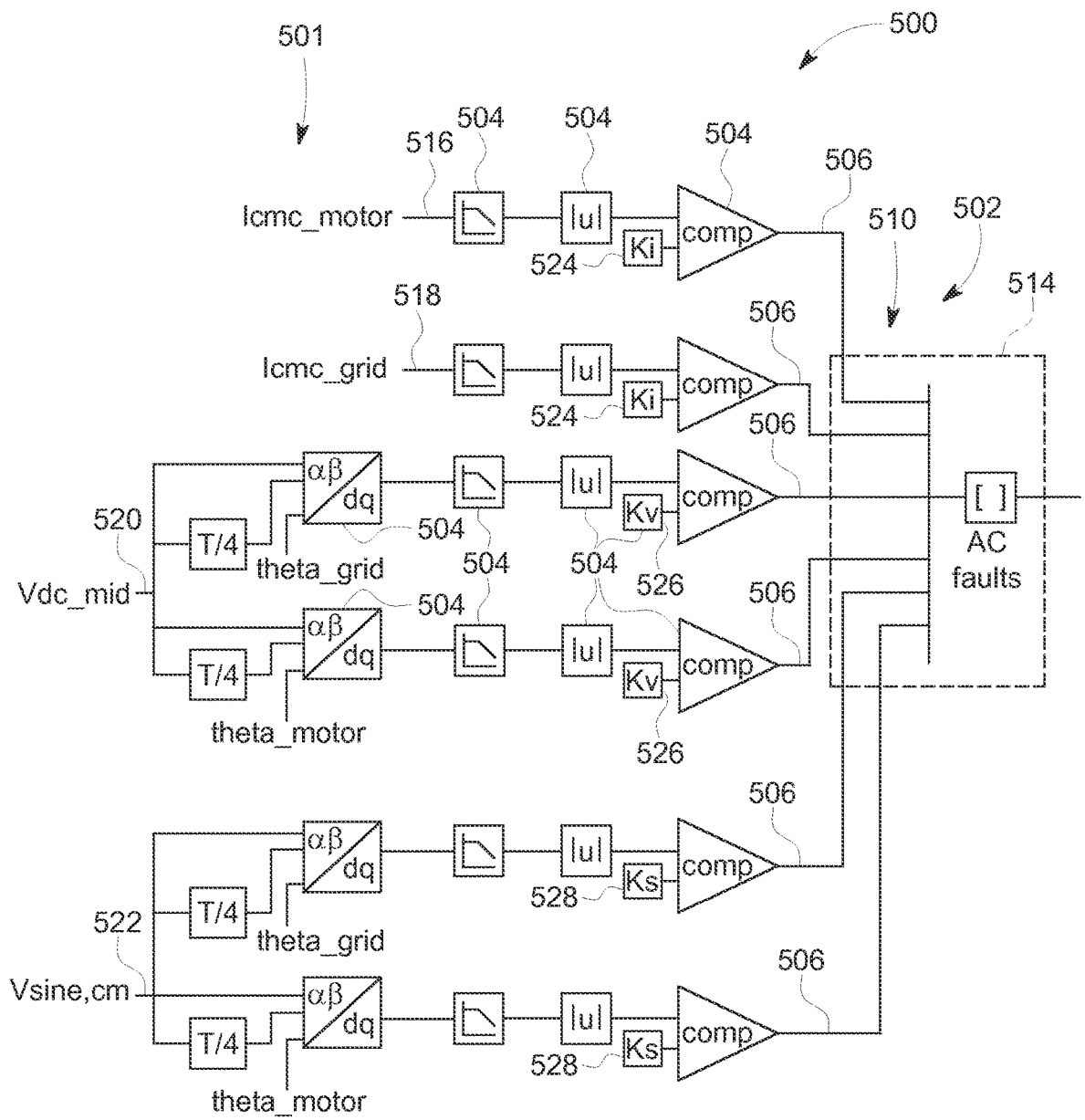
FIG. 6 is a fault logic diagram that may be used with the network shown in FIG. 1 to determine faults in an AC side of the drive systems shown in FIG. 1.

FIG. 6 is a fault logic diagram 500 that may be used with network 100 (shown in FIG. 1) to determine faults in an AC side of drive systems 102 (shown in FIG. 1). Inputs 501 from various sensors and/or virtual sensors that calculate unmeasured parameters are used as inputs to an AC fault logic circuit 502. AC fault logic circuit 502 resides in ground fault detection controller 216 (shown in FIGS. 3-5) or may be a separate stand-alone component communicatively accessible to ground fault detection controller 216. Logic processing blocks 504 indicate operations that are performed on signals as the signals progress through each leg 506 of logic from a respective input 501 to a respective output 510. Outputs 510 are then combined in, for example, an annunciation device 514 to provide an initiation for an alert, a warning, and/or a protective function actuation. In the exemplary embodiment, inputs 501 include a motor side common mode current ($I_{cmc\_motor}$) 516, a grid side common mode current ($I_{cmc\_grid}$) 518, a mid-ground voltage ($V_{dc\_mid}$) 520, and a sine filter common mode voltage ($V_{sine\_cm}$) 522. Inputs 501 are compared to thresholds, for example, a current threshold ($K_i$) 524, a voltage threshold ($K_v$) 526, a sine filter threshold ($K_s$) 528, a DC link faults threshold ($K_{dc}$) 530, and a mid-ground fault threshold ($K_{mid}$) 532.

Figure 7:
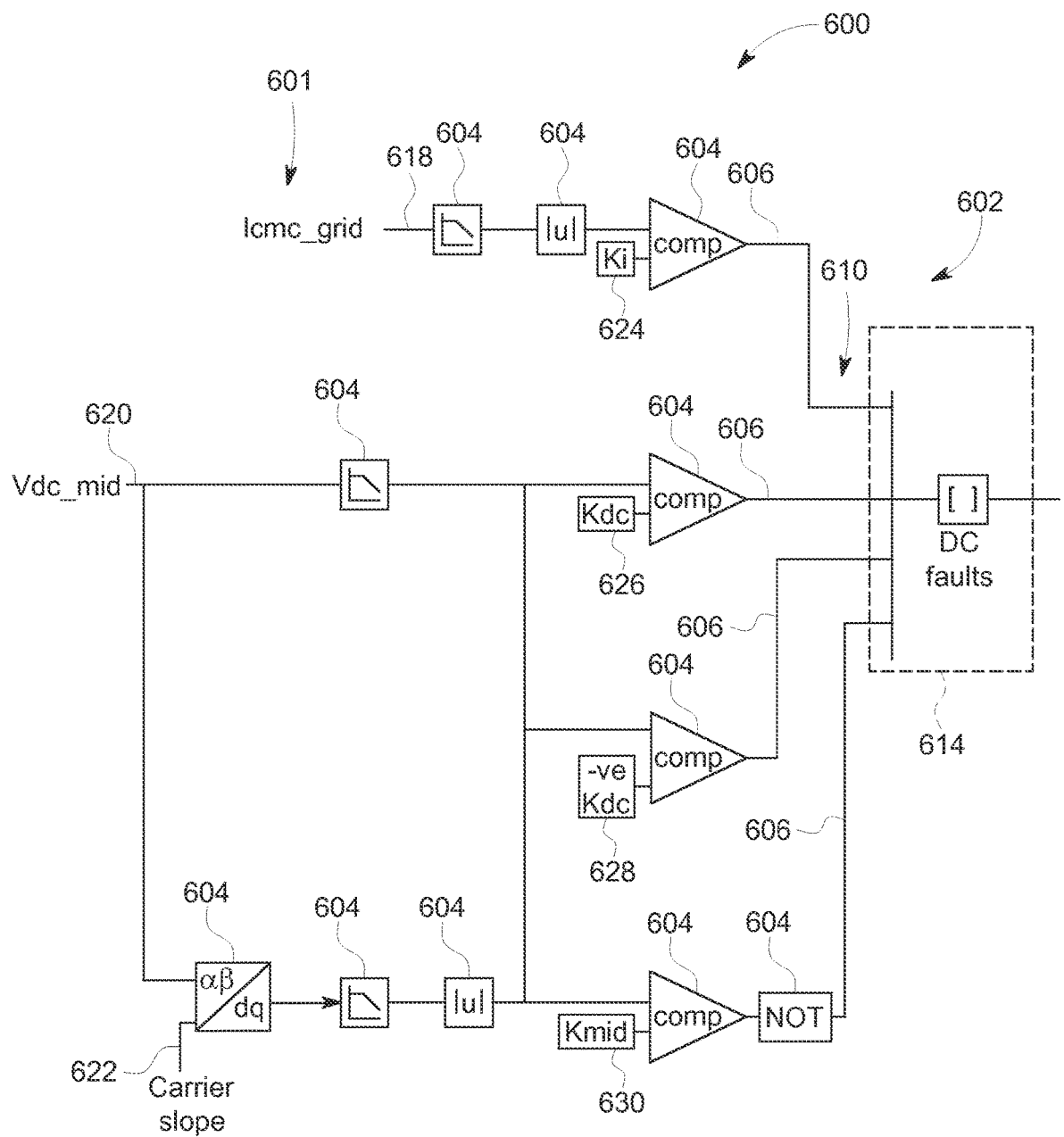
FIG. 7 is a fault logic diagram that may be used with the network shown in FIG. 1 to determine faults in a DC side of the drive systems shown in FIG. 1.

FIG. 7 is a fault logic diagram 600 that may be used with network 100 (shown in FIG. 1) to determine faults in a DC side of drive systems 102 (shown in FIG. 1). Inputs 601 from various sensors and/or virtual sensors that calculate unmeasured parameters are used as inputs to a DC fault logic circuit 602. DC fault logic circuit 602 resides in ground fault detection controller 216 (shown in FIGS. 3-5) or may be a separate stand-alone component communicatively accessible to ground fault detection controller 216. Logic processing blocks 604 indicate operations that are performed on signals as the signals progress through each leg 606 of logic from a respective input 601 to a respective output 610. Outputs 610 are then combined in, for example, an annunciation device 614 to provide an initiation for an alert, a warning, and/or a protective function actuation. In the exemplary embodiment, inputs 601 include a grid side common mode current ($I_{cmc\_grid}$) 618, a mid-ground voltage ($V_{dc\_mid}$) 620, and a carrier slope 622. Inputs 601 are compared to thresholds, for example, a current threshold ($K_i$) 624, a positive DC link faults threshold ($K_{dc}$) 626, a negative DC link faults threshold ($K_{-vc\_Kdc}$) 628 and a mid-ground fault threshold ($K_{mid}$) 630.

Figure 8:
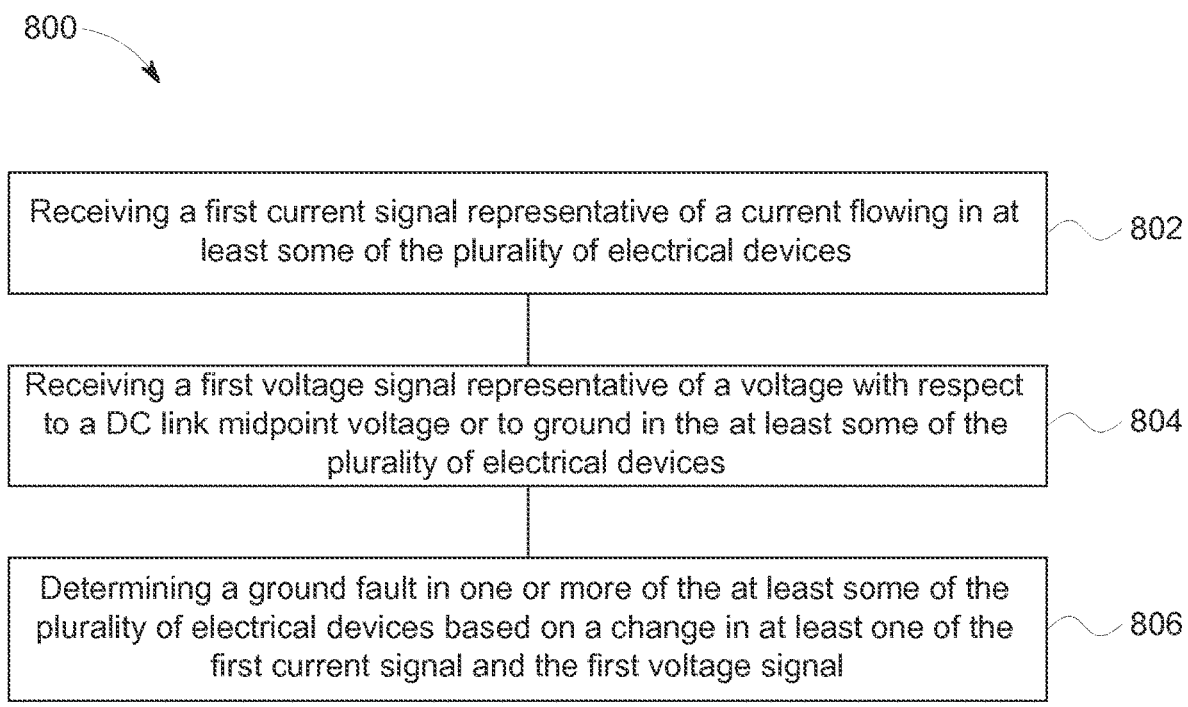
FIG. 8 is a flow chart of a method of detecting a ground fault in one or more electrical devices in a network of a plurality of electrical devices.

FIG. 8 is a flow chart of a method 800 of detecting a ground fault in one or more electrical devices in a network of a plurality of electrical devices. In the exemplary embodiment, method 800 includes receiving 802 a first current signal representative of a current flowing in at least some of the plurality of electrical devices, receiving 804 a first voltage signal representative of a voltage with respect to a DC link midpoint voltage or to ground in the at least some of the plurality of electrical devices, and determining 806 a ground fault in one or more of the at least some of the plurality of electrical devices based on a change in at least one of the first current signal and the first voltage signal.

The above-described embodiments of a ground detection system provide cost-effective methods for detecting, locating, and alerting grounds in non-solidly grounded power systems. The embodiments described herein facilitate operating a network of a plurality of drives, such as, but not limited to VFD drives for electric motors. Specifically, the devices, systems, and methods described herein also facilitate locating a ground fault to a particular drive of q plurality of drives electrically coupled to a common power source and to a component level within a drive. Also, the devices, systems, and methods described herein facilitate isolating a faulted drive prior to an actuation of a protective function of a circuit breaker. Further, the devices, systems, and methods described herein facilitate reducing arcing that may accompany a ground fault such that a non-explosiveness of components in the power system is increased.

As will be appreciated based on the foregoing specification, the above-described embodiments of the disclosure may be implemented using computer programming or engineering techniques including computer software, firmware, hardware or any combination or subset thereof, the technical effect of the methods and systems may be achieved by performing at least one of the following steps: (a) enabling detection of a ground faulted power converter in a network of power converters; (b) localizing a ground fault to a component in a power converter electrically coupled to a common power source with other power converters; (c) using currently installed sensors to provide input parameter values for determining a ground fault; (d) accommodating additional sensor that may be installed in the plurality of power converters to increase ground detection efficiency. Any such resulting program, having computer-readable code means, may be embodied or provided within one or more computer-readable media, thereby making a computer program product, i.e., an article of manufacture, according to the discussed embodiments of the disclosure. The computer readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

The above-described embodiments of a method and system of detecting ground faults in a network of non-solidly grounded power conversion devices provides a cost-effective and reliable means of localizing ground faults to a particular drive and to a specific component within the drive. In addition, the above-described methods and systems facilitate reducing a complexity of the drive system by using already installed sensor to provide inputs to the ground detection system. As a result, the methods and systems described herein facilitate reducing cost while improving the adherence to industrial standards of drive power systems in a cost-effective and reliable manner.

Exemplary embodiments of ground detection systems and methods for localizing a ground fault in a non-solidly grounded network of drives are described above in detail. The ground detection systems and methods of operating such systems are not limited to the specific embodiments described herein, but rather, components of systems and/or steps of the methods may be utilized independently and separately from other components and/or steps described herein. For example, the methods may also be used in combination with other systems requiring ground detection and methods, and are not limited to practice with only the non-solidly grounded network of power drives, and methods as described herein. Rather, the exemplary embodiment can be implemented and utilized in connection with many other power conversion and drive applications, for example, without limitation, multi-megawatt sized drive applications.

Although specific features of various embodiments of the disclosure may be shown in some drawings and not in others, this is for convenience only. In accordance with the principles of the invention, any feature of a drawing may be referenced and/or claimed in combination with any feature of any other drawing.

Unless specifically stated otherwise as apparent from the above discussion, it is appreciated that throughout the description, discussions utilizing terms such as "processing" or "computing" or "calculating" or "determining" or "displaying" or "providing" or the like, refer to the action and processes of a computer system, or similar electronic computing device, that manipulates and transforms data represented as physical (electronic) quantities within the computer system memories or registers or other such information storage, transmission or display devices.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A drive system comprising:
   a current sensor configured to generate a first current signal representative of a current flowing in one or more electrical devices electrically coupled together through a power supply bus, a power output bus, and a common ground;
   a voltage sensor configured to generate a first voltage signal representative of an AC input voltage including a common-mode component in the one or more electrical devices;
   wherein the common-mode component is extracted from the first voltage signal, the common-mode component representing a voltage drop across a common-mode choke due to ground fault currents when a ground fault is present; and
   a controller configured to determine a first ground fault in the one or more electrical devices based on a change in at least one of the first current signal and the first voltage signal;
   wherein, when the first ground fault is detected, the drive system selectively disconnects the one or more electrical devices displaying the first ground fault before a second ground fault occurs.

2. The drive system of claim 1, wherein at least some of the one or more electrical devices includes:
   an AC-DC converter including an AC input and a DC output;
   a DC-AC inverter including a DC input and an AC output; and
   a DC link electrically coupled between the AC-DC converter DC output and the DC-AC inverter DC input.

3. The drive system of claim 2, wherein said voltage sensor is configured to generate a first voltage signal representative of the AC input voltage with respect to the DC link and the common ground in the one or more electrical devices.

4. The drive system of claim 1, wherein said controller is configured to determine the ground fault in the one or more electrical devices based on a change in one or more current signals generated by a respective current sensor in the common ground in the one or more electrical devices.

5. The drive system of claim 1, wherein said controller is configured to determine the ground fault in the one or more electrical devices based on a change of phase in at least one of the first current signal and the first voltage signal.

6. The drive system of claim 1, wherein said controller is configured to generate a signal that initiates an electrical isolation of the one or more electrical devices having the ground fault.

7. A method of detecting a ground fault in one or more electrical devices in a network of a plurality of electrical devices, said method comprising:
   receiving a first current signal representative of a current flowing in at least some of the plurality of electrical devices;
   receiving a first voltage signal representative of a voltage with respect to a DC link midpoint voltage or to ground in the at least some of the plurality of electrical devices;
   determining a first ground fault in one or more of the at least some of the plurality of electrical devices based on a change in at least one of the first current signal and the first voltage signal; and
   selectively disconnecting the electrical devices displaying the first ground fault before a second ground fault occurs.

8. The method of claim 7, wherein receiving the first current signal comprises receiving at least one of an input current signal representative of current flowing into the at least some of the plurality of electrical devices and an output current signal representative of current flowing out of the at least some of the plurality of electrical devices.

9. The method of claim 7, wherein receiving the first voltage signal comprises receiving at least one of an input voltage signal representative of an AC voltage at the input of the at least some of the plurality of electrical devices and a mid-to-ground voltage signal representative of a DC voltage with respect to the DC link midpoint voltage or to ground of the at least some of the plurality of electrical devices.

10. The method of claim 9, wherein the plurality of electrical devices include a plurality of electrical power converters, each of the electrical power converters of the plurality of electrical power converters including an AC-DC converter, a DC link, and a DC-AC inverter coupled in electrical series, and wherein receiving an input voltage signal representative of an AC voltage at the input of the at least some of the plurality of electrical devices comprises receiving an input voltage signal representative of an AC voltage at the input of a respective AC-DC converter.

11. The method of claim 9, wherein the plurality of electrical devices include a plurality of electrical power converters, each of the electrical power converters of the plurality of electrical power converters including an AC-DC converter, a DC link, and a DC-AC inverter coupled in electrical series, and wherein receiving a mid-to-ground voltage signal comprises receiving a mid-to-ground voltage signal representative of a DC voltage of the DC link with respect to ground.

12. The method of claim 7, wherein receiving the first current signal comprises receiving a first current signal representative of a current flowing in a connection of the one or more electrical devices to ground.

13. The method of claim 12, wherein determining the ground fault comprises determining a ground fault in one or more of the at least some of the plurality of electrical devices based on a change in the current flowing in the connection to ground.

14. The method of claim 7, wherein determining the ground fault in one or more of the at least some of the plurality of electrical devices based on a change in at least one of the first current signal and the first voltage signal comprises determining a ground fault in one or more of the at least some of the plurality of electrical devices based 5 on a change in the first voltage signal, wherein a magnitude of change in the first voltage signal is determined by at least one of a phase-to-neutral voltage value at the point of the ground fault, a resistance of the ground fault, and an impedance of the return path from the ground fault.

15. The method of claim 7, wherein determining the ground fault in one or more of the at least some of the plurality of electrical devices based on a change in at least one of the first current signal and the first voltage signal comprises determining a ground fault in a particular one electrical device of the plurality of electrical devices based 5 on a relative change in at least one of the first current signal and the first voltage signal of the particular one electrical device of the plurality of electrical devices and at least one of a first current signal and a first voltage signal of another one electrical device of the plurality of electrical devices.

16. An electrical power converter system comprising:
a plurality of power converter devices electrically coupled to a single power supply bus, each power converter device of the plurality of power converter devices is non-solidly grounded, each said power converter device comprising:
an AC-DC converter comprising an AC input and a DC output;
a DC-AC inverter comprising a DC input and an AC output; and
a DC link electrically coupled between a DC output of said AC-DC converter and a DC input of said DC-AC inverter; and
a ground fault detection controller configured to determine a first ground fault in said one or more of the plurality of power converter devices based on a change in at least one of an AC input current signal, an AC output current signal, and a voltage signal of said DC link with respect to ground;
wherein, when the first ground fault is detected, the drive system selectively disconnects said one or more of the plurality of electrical devices displaying the first ground fault before a second ground fault occurs.

17. The system of claim 16, wherein said ground fault detection controller is configured to determine a ground fault in said one or more of the plurality of power converter devices based on a change in at least one of a magnitude and phase of at least one of the AC input current signal, the AC output current signal, and the voltage 5 signal of said DC link with respect to ground.

18. The system of claim 16, further comprising a ground path current sensor configured to generate a current signal representative of current flowing to ground from a respective power converter device.

19. The system of claim 16, wherein said ground ground fault detection controller is configured to generate a signal that initiates an electrical isolation of said one or more of the plurality of power converter devices having the ground fault.

* * * * *